United States Patent
Acharya

[19]

[11] Patent Number: 6,166,664
[45] Date of Patent: Dec. 26, 2000

[54] EFFICIENT DATA STRUCTURE FOR ENTROPY ENCODING USED IN A DWT-BASED HIGH PERFORMANCE IMAGE COMPRESSION

[75] Inventor: Tinku Acharya, Tempe, Ariz.

[73] Assignee: Intel Corporation, Santa Clara, Calif.

[21] Appl. No.: 09/140,517

[22] Filed: Aug. 26, 1998

[51] Int. Cl.[7] .................................................. H03M 7/00
[52] U.S. Cl. ................................................ 341/63; 341/59
[58] Field of Search .................... 341/50, 59, 63, 341/65, 67

[56] References Cited

U.S. PATENT DOCUMENTS 5,845,243  12/1998  Smart et al. ............................ 704/230
6,023,296  2/2000   Lee et al. ............................... 348/405

*Primary Examiner*—Brian Young
*Attorney, Agent, or Firm*—Blakely, Sokoloff, Taylor & Zafman LLP

[57] ABSTRACT

What is disclosed is a method that allows a fixed length (L) codeword and flag to serve as a structure for encoding large run of identical values, a single bit capable of representing $2^L$ such values. The zero non coding method may be utilized to efficiently encode data sets, such as images or other data files with large consecutive runs of a particular value such as zero. In an entropy encoding scheme, such enhanced zero run coding may be combined with variable length coding for non-zero values.

17 Claims, 7 Drawing Sheets

ENCODING: EACH $S_i$ IS ASSIGNED AN $L_i$ FOR ENCODING

EFFICIENT DATA STRUCTURE FOR ENTROPY ENCODING USED IN A DWT-BASED HIGH PERFORMANCE IMAGE COMPRESSION

BACKGROUND OF THE INVENTION

1. Field of the Invention

The invention relates generally to data and image compression. More specifically, the invention relates to binary encoding for data and image compression, particularly where quantization and discrete wavelet transform techniques are utilized.

2. Description of the Related Art

In image and/or data compression, through a process known as encoding, a set of values, such as text or numerical data that are obtained or input externally, can be encoded into binary form (1s or 0s). One way of encoding is to simply convert each decimal number or code for text (such as ASCII numerical designations) into a fixed number of bits (word size). For instance, the numbers 23, 128, and 100 would be encoded into binary as the sequence: 00010101 1000000 01100100. This raw or pure binary code serves no further compression function, since it merely takes the data and represents it in a fixed length binary number. Such encoding is inefficient where the number of zeroes greatly outweigh the non-zero, and especially where such zero data values are consecutive, creating a large "run" of zeroes in binary. Several methods have been developed particularly in the field of digital communications to compress data during binary conversion. Among two widely-used such methods of binary encoding for image or data compression are Huffman Coding and Run-Length Encoding.

Classical Huffman Coding is a variable length coding technique which consists of coding each possible value $y_i$ (i=1, . . . , N) inside a given data set S of N possible data values by codewords of $L_i$ bits each. The goal behind Huffman Coding is to minimize (symbol) $L_i$ $P(y_i)$, where $P(y_i)$ is the probability of the value $y_i$ occurring in data set S that is to be encoded. In Huffman coding, the frequently appearing symbol $y_i$ are assigned smaller length codes in order to achieve compression. The codewords are chosen in order to make them distinguishable from each other. The codewords have a variable length, for instance, for a data set S={0, 1, 2, 3, 4} the Huffman Coding may use the mapping {0=0, 1=10, 2=110, 3=1110, 4=1111}. If P(0)>>P(1)>>P(2)>>P(3)>>P(4), this technique may be more efficient than straight fixed length binary representation. The Huffman Coding is efficient primarily when coding data sets S with a small N or that have a small variance, since $L_i$ grows in size almost linearly with an increase in N, the number of values in the set. For this reason, a technique different from classical Huffman Coding known as Modified Huffman Coding has been developed and used in image that have larger N in their data sets or more variance.

In Modified Huffman Coding, the data value $y_i$ is encoded by a data structure having two fields: a Range, (that identifies a set containing $2^{Range}$ values) and a Pointer indicating a specific value inside Range. The field Range is coded using Huffman coding, and Pointer is expressed as a binary number having a size of Range bits. As an example, the values included in a Range of 1 to n values could be:

Range=0: values {0} (the field Pointer is not needed)
Range=1: values {−1, 1} (the field Pointer needs 1 bit to indicate a specific value).
Range=2: values {−3, −2, 2, 3} (the field Pointer needs 2 bits).
Range=n: values {$-2^n+1, -2^n+2, \ldots, -2^{n-1}, 2^{n-1}, \ldots, 2^n-2, 2^n-1$} (the field Pointer needs n bits).

For instance, if the data to encode are the integer values {−3, −2, −1, 0, 1, 2, 3}, a possible MHC for each of them could be that shown in the Table 1:

TABLE 1

| $y_i$ | Range | Huf Code for Range | Pointer having Range bits | Complete code (MHC) |
|---|---|---|---|---|
| −3 | 2 | 11 | 11 | <u>11</u>11 |
| −2 | 2 | 11 | 10 | <u>11</u>10 |
| −1 | 1 | 10 | 1 | <u>10</u>1 |
| 0 | 0 | 0 | — | <u>0</u> |
| 1 | 1 | 10 | 0 | <u>10</u>0 |
| 2 | 2 | 11 | 00 | <u>11</u>00 |
| 3 | 2 | 11 | 01 | <u>11</u>01 |

The value 0 is coded only by a word 0 (i.e., the Huffman coding of the Range and no other bits). The value 3 is coded by <u>11</u>01, where the underlined <u>11</u> is the Huffinan code of the Range 2, and the following 2 (=Range) bits, 01, "point" to the value 3 among the possible values {−3, −2, 2, 3} that also have a Range=2 in the table. If P(0) is high, the above described approach is more efficient than a normal fixed length binary coding where each value would be coded by 3 bits regardless of its probability of occurrence, since only one bit in the MHC of Table 1 is used for zero values. The MHC is naturally designed for a table look-up architecture and thus can be more efficient for both encoding and decoding.

Another technique known as Zero Run Coding (ZRC) is a technique for encoding a data set containing a large number of consecutive or "runs" of zero values. ZRC consists of encoding only the values different from zero (using Huffman Coding or some other coding) and then interleaving these codewords by a code that specifies the number of zeroes that, according to a manner known both to the coder and to the decoder, divides two consecutive non-zero values.

In traditional ZRC, the encoded zero run data is structured using two segments: a run length and non-zero value. For instance, instead of coding the data stream:

{0 0 0 0 0 0 5 0 0 0-6 78 0 0 0 0-12 0 0 0 0 0 0 0 0 0 0 1 45 0 0 0 0 0 0 0 0 0 23} only the following data are coded:

{[<u>6</u>, 5] [<u>3</u>, −6] [0, 78] [<u>4</u>, −12] [<u>12</u>, 1] [<u>0</u>, 45], [<u>9</u>, 23]}

This code (where an _ indicates a run length of zeroes) indicates that 6 zeroes followed by the value 5, then 3 zeroes followed by the value −6, then 0 zeroes followed by the value 78, . . . , etc.

When either of these techniques are utilized in the compression of images, the nature of the image compression prior to encoding scheme should point to the best choice of method. In order to consider whether Huffman Coding or run length coding should be used, the nature of the image or application (such as videoconferencing) may need to be analyzed and considered. For images with high entropy, run-length encoding may not provide as high a compression ratio as Huffman Coding and vice-a-versa. When both zero run length encoding and Huffman coding are combined, such encoding is after called "entropy encoding" since information is represented in a minimum number of bits in accordance with content (entropy) of the whole data set. The inability to tune the binary encoding process to the characteristic of the data set (or subset of the data set), may result in overall compression ratios that are not optimal.

In the art of imaging, after an image is captured (by a device such as a digital camera) the image is often "compressed" (prior to binary encoding) or reduce the total number of bits that would be needed to represent the image. "Primary" image compression and subsequent binary encoding of that compressed data plays a key role in multimedia applications such as videoconferencing, digital imaging and video streaming over a network. Primary image compression schemes for such applications should be designed to reduce the bit-rate of storage or transmission of the image while maintaining acceptable image quality for the specific application.

One commonly used primary image compression technique is known as JPEG (Joint Photographic Experts Group) which transforms pixels of an input image using the well-known Discrete Cosine Transform (DCT). The resulting transformed pixel values are quantized or mapped to smaller set of values in order to achieve compression. The quality of a compressed image that is decompressed will depend greatly on how the quantization of the transformed pixels are performed. The compression ratio (the size of the original raw image compared to the compressed image) will also be affected by the quantization, but can be further affected by the subsequent binary encoding of the data after quantization.

The subsequent binary encoding of JPEG compressed image data is limited, if run length encoding is used, by "blocking". For JPEG, an image is divided into blocks of pixels such as 8×8, or 16×16 blocks. These blocks are processed independently of each other and thus, the maximum run-length possible is the size of the block (64 or 256). Thus, if run-length encoding is used, the run-length value is 6 bits or 8 bits wide. Hence, for JPEG, run-length encoding may held fixed in the number of bits comprising the run-length. Where block-based coding is not utilized, such fixed number of bits for coding each "run" (i.e., the number of consecutive zeroes), can become a serious limit, since the longest value for a run depends from the dimension of the whole image.

Other primary image compression schemes which achieve high compression ratios and also acceptable decompressed image quality, may generate image "sub-bands" or image frequency regions, which unlike JPEG blocks, are not fixed but varying in size since they do not divide the image in blocks. One such primary image compression scheme based upon the Discrete Wavelet Transform (DWT) is presented in related U.S. patent application, Ser. No. 09/083,383 entitled "The Compression of Color Images Based on a 2-Dimensional Discrete Wavelet Transform Yielding a Perceptually Lossless Image " (hereinafter "DWT patent"). In such a DWT-based scheme, each sub-band and channel (color plane or difference of color planes) may have properties that justify the use of Huffman Coding rather than run-length encoding especially in sub-bands with high entropy.

If images are to be compressed and then encoded on a digital camera or other imaging device, ordinary run-length encoding for JPEG is inadequate. Thus, there is a need for a run-length encoding scheme which allows a variable and exceptionally large run-length value to be encoded while keeping a fixed length structure such that decoding can be more real-time. Further, where primary image compression generates data in stages (e.g., one stage for each sub-band), where the data at each stage has properties which favor the use of one type of encoding over another, there is a need to provide an adaptive encoding process so that each stage may be treated with the most efficient encoding possible. Such mechanisms would maximize the compression gained during encoding and thus, reduce the storage/transfer size required for an image or for other data.

SUMMARY OF THE INVENTION

A method comprising determining a number of bits L utilized to store a word R, said word R accompanied by a flag, said flag and word R comprising a structure; and encoding the length of a run of similar data values, said length larger than allowable by said L bits of the word R even if each of said L bits were fully utilized, said encoding achieved by utilizing a single bit to represent $2^L$ similar data values in the run.

BRIEF DESCRIPTION OF THE DRAWINGS

The objects, features and advantages of the method and apparatus for the present invention will be apparent from the following description in which.

DETAILED DESCRIPTION OF THE INVENTION

Referring to the figures, exemplary embodiments of the invention will now be described. The exemplary embodiments are provided to illustrate aspects of the invention and should not be construed as limiting the scope of the invention. The exemplary embodiments are primarily described with reference to block diagrams or flowcharts. As to the flowcharts, each block within the flowcharts represents both a method step and an apparatus element for performing the method step. Depending upon the implementation, the corresponding apparatus element may be configured in hardware, software, firmware or combinations thereof.

FIGS. 1(a)–1(e) are the essential data structures for modified zero run length encoding according to one embodiment of the invention.

Figure 1A:
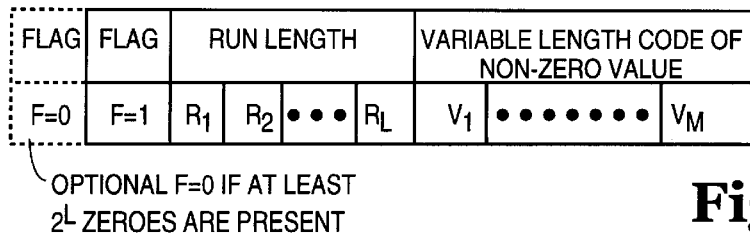
FIGS. 1(a)–1(f) are the essential data structures for enhanced zero run encoding according to one embodiment of the invention.
Figure 1B:
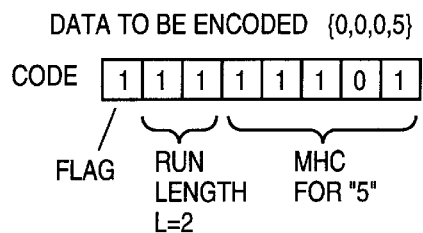

In the JPEG standard, because of the 8×8 blocking strategy, the size of the run in the ZRC may assume a value not higher than 63 and thus can be fixed to 6 bit word. If we consider an entire sub-band generated by a two-dimensional DWT, the upper limit on the size of the run value depends on the size of the whole image. For instance, in a megapixel resolution image (e.g. 1024×1024), the size of a level 2 DWT sub-band is 512×512 and hence the maximum run value would be 512×512. Therefore, one embodiment of the invention provides a flexible structure for encoding the size of the run defined as the number of zeroes between two non-zero values). The structure for encoding is composed of a Flag F and a word R of L bits or just contains the flag F, in certain specified instances described below. FIG. 1(a) shows the basic format encoding data according to the invention. In this format, structure a of the type (F, R) is followed by a variable length code V of M bits such as an MHC (Modified Huffman Code) of any non-zero values that follow the run of zeroes encoded by (F,R). Each of the ZRC structures (F, R) and has a one-bit F value and the structure additionally contains a word R with bits $R_1 \ldots R_L$. The length of the run, by definition, terminates when a non-zero value is encountered in the data set to be encoded. FIG. 1(b) is an example of this structure when used to encode the data set {0, 0, 0, 5}. An optional bias of F=0 with no word R following it may be part of the run encoding, and according to an embodiment of the invention refers to $2^L$ zeros. Assuming that L, the length of R is two, then the run of three zeroes are encoded by a Flag F of 1 and the run-length 3 (11 in binary) and hence the structure (1,11). For encoding the value "5" which follows the run of three zeroes, a variable length code such as MHC is illustrated. One possible MHC for the value 5 is "11101". MHC is well-known in the art and is used by way of example only. Any variable or fixed length code can be used to represent the non-zero value.

Figure 1C:
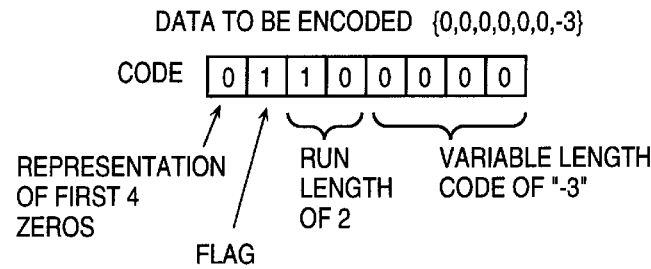
Figure 1D:
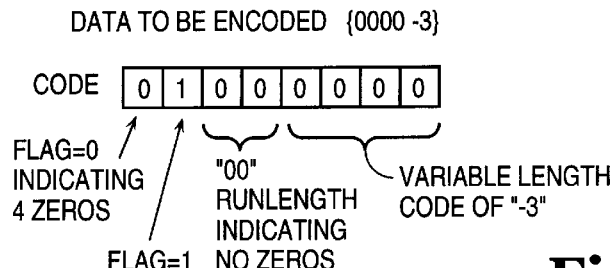
Figure 1E:
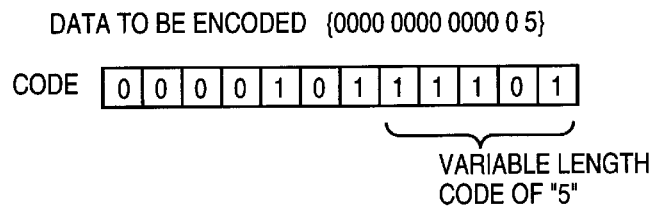

If total length of the run (number of consecutive zeroes) is longer than $2^L-1$, typical ZRC would be unable to encode it except by repeating another run-length structure. According to one embodiment of the invention, when the length of the run is greater than $2^L-1$, only a flag F=0 is output which represents the presence of a block of $2^L$ (BLOCK_SIZE) zeroes. FIG. 1(c) shows an example of such a case. Assume again as in FIG. 1(b) that L is 2 giving a BLOCK_SIZE value of 4. If the data set to be encoded is {0, 0, 0, 0, 0, 0, −3}, then the first 4 zeroes would be represented by merely outputting the flag zero with no other following indicator. The next two zeroes (in the total run of six zeroes) would be encoded similar to the zeroes encoded in FIG. 1(b), and thus would be represented by a flag of 1 followed by "10" (the binary representation of 2). With the first six zeroes thus represented, then the variable length code for "−3" can then be output, which is shown as "0000". When decoding this codeword sequence, the "0" which begins the block "0000" will not be confused with a "0" indicating a run of $2^L$ zeroes since a variable length code for a non-zero value always follows a run of zeros value that has a flag of 1. A potential race condition may be created where the run length equals exactly the value BLOCK_SIZE or a multiple of BLOCK_SIZE, a solution to which is illustrated in FIG. 1(d). In FIG. 1(d), the data set to be encoded {0, 0, 0, 0, −3} has a run of exactly 4 zeros, which is equal to BLOCK_SIZE if an L value of 2 is utilized. A single value "0" in the code indicates that 4 zeroes are present. However, since no other zeroes are present in the run, it would not ordinarily be necessary to include a structure (F,R). However, since the decoder would only be able to recognize the coming of a non-zero variable length code predicated upon there being a structure (1,R) preceding it, merely including the code "0000" for the non-zero value "−3" would create during decode an insoluble race condition. To prevent this, the structure (1,R) that the decoder would expect to see should be included. Thus, following the "0" which represents a BLOCK_SIZE number of zeroes in the data set to be encoded, a structure (1,0) i.e., the bit sequence "100" is included in the code prior to the variable length code for the non-zero value "−3". Thus, the code for the sequence {0, 0, 0, 0, −3} is "0 1 00 0000". The advantage of being able to represent a large number of zeroes (a block of $2^L$ zeroes) with a single bit allows an arbitrarily large number of zeroes where the total possible run size is indeterminate to be efficiently represented. FIG. 1(e) illustrates this advantage. In FIG. 1(e), the data to be encoded includes a run of 13 zeroes followed by a non-zero value "5". Advantageously, if L=2, then each block of (BLOCK_SIZE=) 4 zeroes can be represented by a single zero. Thus, the twelve zero values can be encoded using the code sequence "000". The thirteenth zero in the run is encoded with the sequence "101" (Flag of 1 and R value "01"). The flag of one indicates that after the F,R structure, a variable length code follows. Again, as with FIG. 1(b), an MHC for the data element "5" may yield the code "11101".

Figure 1F:
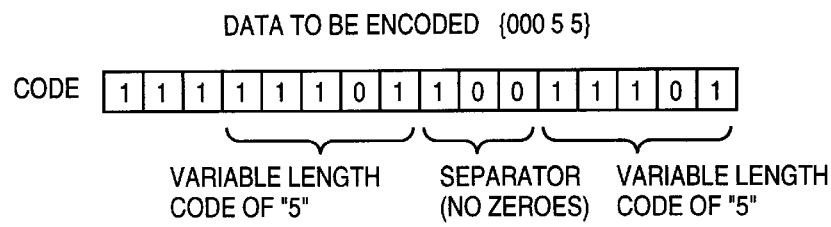

FIG. 1(f) illustrates the case where two non-zero values occur immediately adjacent to one another in the data set. In FIG. 1(f), a run of three "0"s are followed by two consecutive, non-zero values 115. In order for the decoding process to distinguish this case, a separator must be placed between the two non-zero values which is a run length structure indicating an absence of any zeros. Thus, like FIG. 1(d), a structure "100" is placed as a separator between the variable length code for the non-zero values "5". This prevents the decoder from mistakenly assuming that a zero run coding follows the first "5". In general, the code for each non-zero value must be preceded by a zero run code, even if no zeros are present. This separation rule allows the decoder to adequately discern between variable length codes for non-zero values and zero run codes.

Likewise, any number of structures in the output order $(1,R_0) (1,R_1) (1,R_{I-2}) (0,R_{I-1})$ may be used where I×M bits is the total number of bits required to encode r+1. In this scenario I-1 structures have a flag of 1, while the Ith structure has a flag of 0. One advantage of the modified ZRC in one embodiment of the invention is that the size of the run may be unlimited and still encodable using a fixed length structure (F,R) of R having only M bits.

For coding the non-zero value following each run, we may choose an MHC technique such as that shown in related U.S patent application, Ser. No. 09/109,475 entitled "Real Time Algorithms And Architectures For Coding Images Compressed By DWT-Based Techniques". The zero value represented in other MHCs would not need to be encompassed by the MHC or variable length code utilized with the invention since ZRC handles all occurrences of zero values in the data set. MHC is used by way of example and will not be discussed since those of ordinary skill the art are familiar with MHC and other variable length data value encoding techniques.

Figure 2:
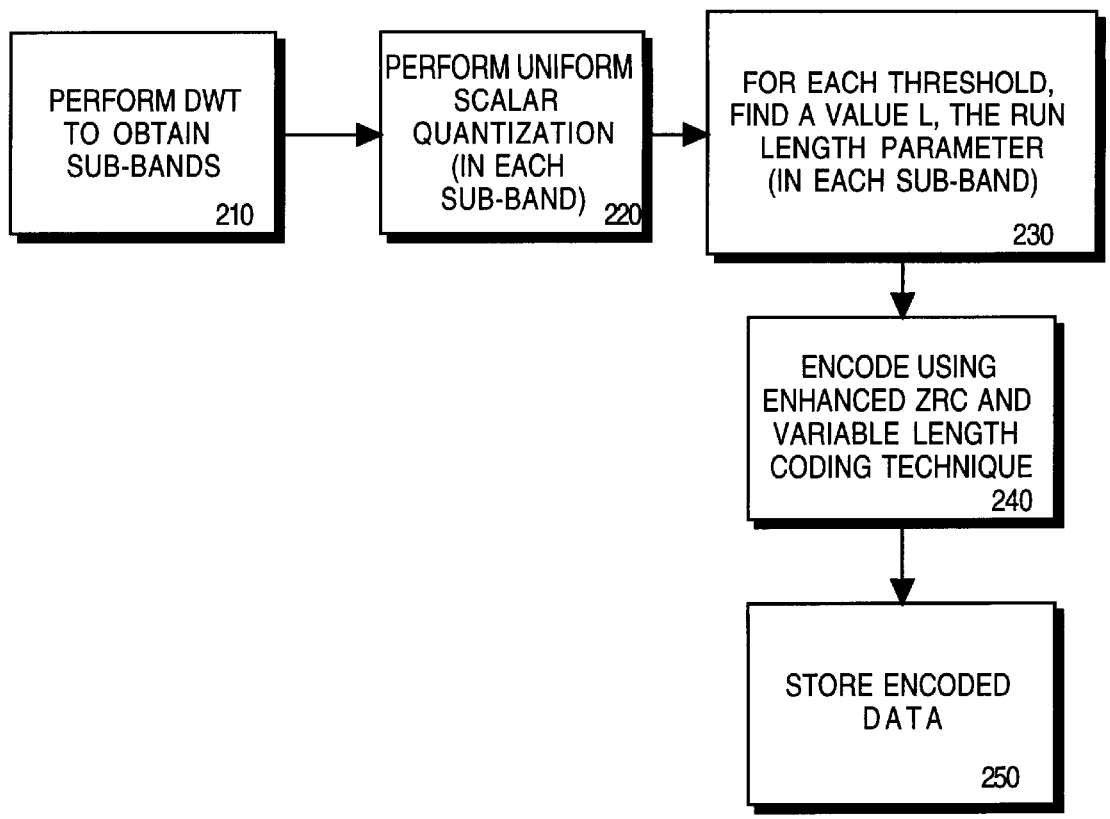
FIG. 2 illustrates image processing data flow according to one embodiment of the invention.

FIG. 2 illustrates image processing data flow according to one embodiment of the invention.

It is often desirable in digital applications such as still or motion imaging that an original image such as one captured by a digital camera be compressed in size as much as possible while maintaining a certain level of quality prior to its being transferred for decompression and/or display. One such image compression technique is based upon the DWT (Discrete Wavelet Transform) mentioned above. Such a technique can yield compressed image data which can advantageously utilize the zero run-length coding scheme of the invention to achieve a more compact total data set after binary encoding.

In the DWT-based image compression scheme shown in FIG. 2, the first process is to subject the captured or input image to a DWT (block 210) in a number of levels. This will result in a data set that is divided into image sub-bands (see FIG. 3). The DWT transformed data set will have the same number of values, but each value within the set may have a higher bit-depth (size) than the pixels of the original image due to peculiarities of the DWT process. Further, the image compression of FIG. 2 may be performed either on the entire image or separately upon "color planes" of the image such as R, G and B planes generated by a Bayer pattern. After or during the DWT, a second process known as quantization is also performed.

Quantization is the process of mapping a set of n possible values to a set of m possible, where m<n. By quantizing, the total range of possible values for the each of the data in the DWT transformed image data set is reduced. One form of quantization that may be employed is uniform scalar quantization as shown in block 220 of FIG. 2. In uniform scalar quantization, each data value is essentially divided by a threshold value T, and then rounded to the nearest integer (if integer math is desired). Additionally, each sub-band region may have a separate and possibly different threshold value T assigned it. When the threshold T is modified for each sub-band, the overall compression ratio and loss of image quality can be reduced. Thus, the scalar quantization can be "uniform" within a particular sub-band, applying the same threshold T to all data values within that sub-band. After quantization, the quantized data set can be binary encoded. Since the quantized data set will likely have some runs of zeroes (more prevalent in certain sub-bands) an enhanced ZRC as disclosed herein may be utilized to encode the quantized data set.

Enhanced ZRC, as disclosed in the embodiments of the invention, utilizes a novel data structure for encoding of zero runs along with a variable code such as MHC for non-zero data values, and thus describes an entropy encoding technique. One component of the zero run encoding is to define a constant L which fixes the word size of R, the run length parameter, in the structure (F,R). According to the invention, $2^L$ zeroes are represented by transmitting only the flag 0, and any run of less than $2^L$ by the structure (F,R) where F=1, and R is of size L. Since, as described below, each sub-band of data utilizes its own quantization threshold parameter, each quantized sub-band will have different probable zero run composition. One sub-band may have more runs of zeroes than another, due to both the DWT and the quantization thresholding. Thus, depending on which sub-band of quantized data is being encoded, the value of L can be varied. Thus, each sub-band i may be assigned its own run length parameter $L_i$ (block 230). For instance, in a sub-band with higher entropy (likelihood more non-zero values than zero values), a smaller $L_i$ may be chosen. The set of run length parameters L for the sub-bands may be included in header information for the compressed image. The set L may be fixed the same for any and all images in the compression process or can be modified according to the peculiar nature of each image. When a set of run length parameters L is determined, then the quantized data can be encoded using the enhanced ZRC technique (and variable length codes for non-zero values) discussed herein (block 240). The encoded data may then be stored or transferred (block 250). Advantageously, the use of only a single bit, a "0", to represent an entire string of $2^L$ zeroes in the data set greatly increases the overall compression ratio, reducing the size of the data transfer or storage. When the image is decoded, the set of run-length parameters L will allow the decoder to correct retrieve the data values in their state after quantization.

Depending upon the precise parameters used for DWT transformation, quantization and encoding, the compression ratio, which the size of the original image divided by the size of the compressed and encoded image, will vary. This embodiment of the invention provides for an adaptive encoding process that can serve to advantageously optimize the compression ratio in each sub-band generated by the DWT compression and quantization process.

One important aspect of the invention is an enhanced zero run encoding scheme. The enhanced scheme may be utilized in any image or data compression process, with the use of a DWT compression process being merely exemplary. Further any portion of a data set that has a greater likelihood of zero values than other portions may have its own L parameter defined. One of ordinary skill in the art will be able to determine by empirically or statistical prediction how to define L parameters as best suits the application or data.

Figure 3:
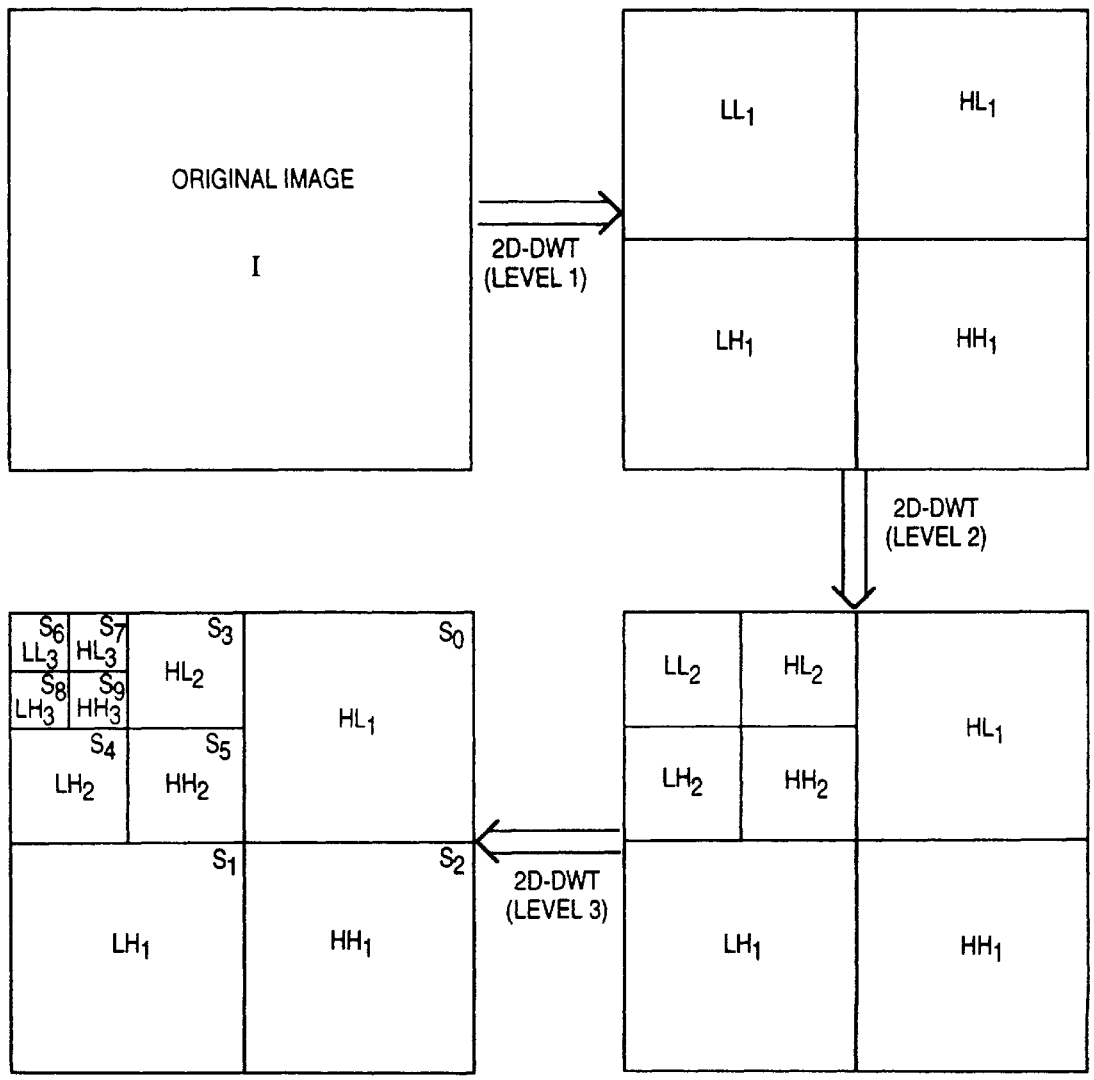
FIG. 3 illustrates sub-bands generated by three levels of a DWT (Discrete Wavelet Transform).

FIG. 3 illustrates sub-bands generated by three levels of a DWT (Discrete Wavelet Transform).

The application of a two-dimensional DWT upon an image space will result in the creation of four "sub-bands." For instance, FIG. 3 shows that an image I is decomposed by a two-dimensional DWT into four sub-bands $LL_1$, $HL_1$, $LH_1$ and $HH_1$. The "$LL_1$" sub-band is so designated based on the double low-pass DWT filtering used to generate it. The $L_i$ sub-band is essentially a scaled approximation of the original image I, and contains the most salient image information. The sub-bands $HL_1$, $LH_1$ $_{and}$ $_{HH1}$ contain certain edge information and high-frequency noise and are so designated due to the various low-pass and high-pass DWT filtering used to generate them. Since the sub-bands $HL_1$, $LH_1$ and $HH_1$ are visual perception-wise less significant than the $LL_1$ sub-band, these sub-bands may be more "roughly" quantized (i.e., assigned a higher threshold T) so that the quantized values therein may have a lower possible range. Further, the $LL_1$ sub-band does not need to be quantized directly if this sub-band is utilized in generating higher level DWT resolution as shown in FIG. 3. The decomposition of the image I into the four sub-bands is considered a level 1 DWT. To indicate this, the subscript 1 is used after LL, HL, LH and HH.

The level 1 sub-bands $LL_1$, $HL_1$, $LH_1$ and $HH_1$ result from applying a two-dimensional DWT once to the image I. If the 2-D DWT is applied again to the sub-band $LL_1$, a level 2 2-D DWT is said to have been performed. The level 2 2-D DWT would result in the generation of four new sub-bands $LL_2$, $HL_2$, $LH_2$ and $HH_2$ which are sub-bands generated from the sub-band LLI from the level 1 2-D DWT. Like the $LL_1$ sub-band, the $LL_2$ sub-band contains the most important visual information from $LL_1$ while the $HL_2$, $LH_2$ and $HH_2$ sub-bands contain edge and noise information present in $LL_1$. A 2-D DWT may be thus applied many times to LL sub-band of each level to obtain more and more levels of DWT resolution and thus, more sub-bands.

Each DWT resolution level k contains 4 sub-bands, $LL_k$, $HL_k$, $LH_k$ and $HH_k$. The first level of DWT resolution is obtained by performing the DWT upon the entire original image, while further DWT resolution (level k+1) is obtained by performing the DWT on the $LL_k$ sub-band. The $LL_k$ sub-band contains the most significant image information representing the image or previous level sub-band $LL_{k-1}$. Also, the level K sub-bands $HL_k$, $LH_k$ and $HH_k$ contain edge and high frequency noise information of the image or previous level sub-band $LL_{k-1}$.

FIG. 3 shows the application of the DWT to achieve three levels of resolution. The original image I, the $LL_i$ sub-band, and the $LL_2$ sub-band are all subjected to the 2-D DWT and resolved into component sub-bands. The result of a three level 2-D DWT is the generation of ten sub-bands -$HL_1$, $LH_1$, $HH_1$, $HL_2$, $LH_2$, $HH_2$, $LL_3$, $HL_3$, $LH_3$ and $HH_3$- labeled S0, S1, S2, S3, S4, S5, S6, S7, S8 and S9, respectively. As shown in FIG. 2, once such a DWT procedure is completed, and the desired level of resolution reached, the sub-band data may be quantized in a uniform scalar manner. A single quantization threshold T may be applied for all the sub-band data such that if X is a sub-band data value, [X/T] (where [y] rounds Y to the nearest integer) will be the quantized value. Alternatively, and in some cases advantageously, each sub-band $S_i$ may be assigned its own quantization threshold $T_i$, such that a sub-band i data value $X_i$ has quantized value of $\lceil X_i/T_i \rceil$. For instance, for each of the ten sub-bands.

By applying such scalar quantization with quantization thresholds that are uniform with respect to a particular sub-band, the properties of that sub-band can be exploited to optimize compression while maintaining visually perceptible image quality. The applying sub-band specific quantization yields quantized sub-bands that each may have a differing likelihood of zero versus non-zero values. The sub-bands $S_0 \ldots S_9$, after sub-band uniform scalar quantization, may thus be each encoded in a slightly differing manner. Referring to the enhanced zero run encoding scheme described above with respect to FIGS. 1(a)–1(f), a separate value for L, the run length parameter may be chosen for each quantized sub-band. Thus, each sub-band $S_i$ depicted in FIG. 3 may be assigned a corresponding Li, yielding a set of ten run length parameters $L_0 \ldots L_9$. According to an embodiment of the invention, the choice of an $L_i$ for each sub-band has the following effects:

1. The BLOCK_SIZE which equals $2^{L_i}$ may be different for each sub-band such that the flag) when transmitted may be able to represent fewer or more zeroes (but always of BLOCK_SIZE) when compared with other zeroes. 2. The number of bits in the word R in the structure (1,R) which encodes a string of less than BLOCK_SIZE zero values is $L_i$, and thus may be different for each sub-band.

Figure 4:
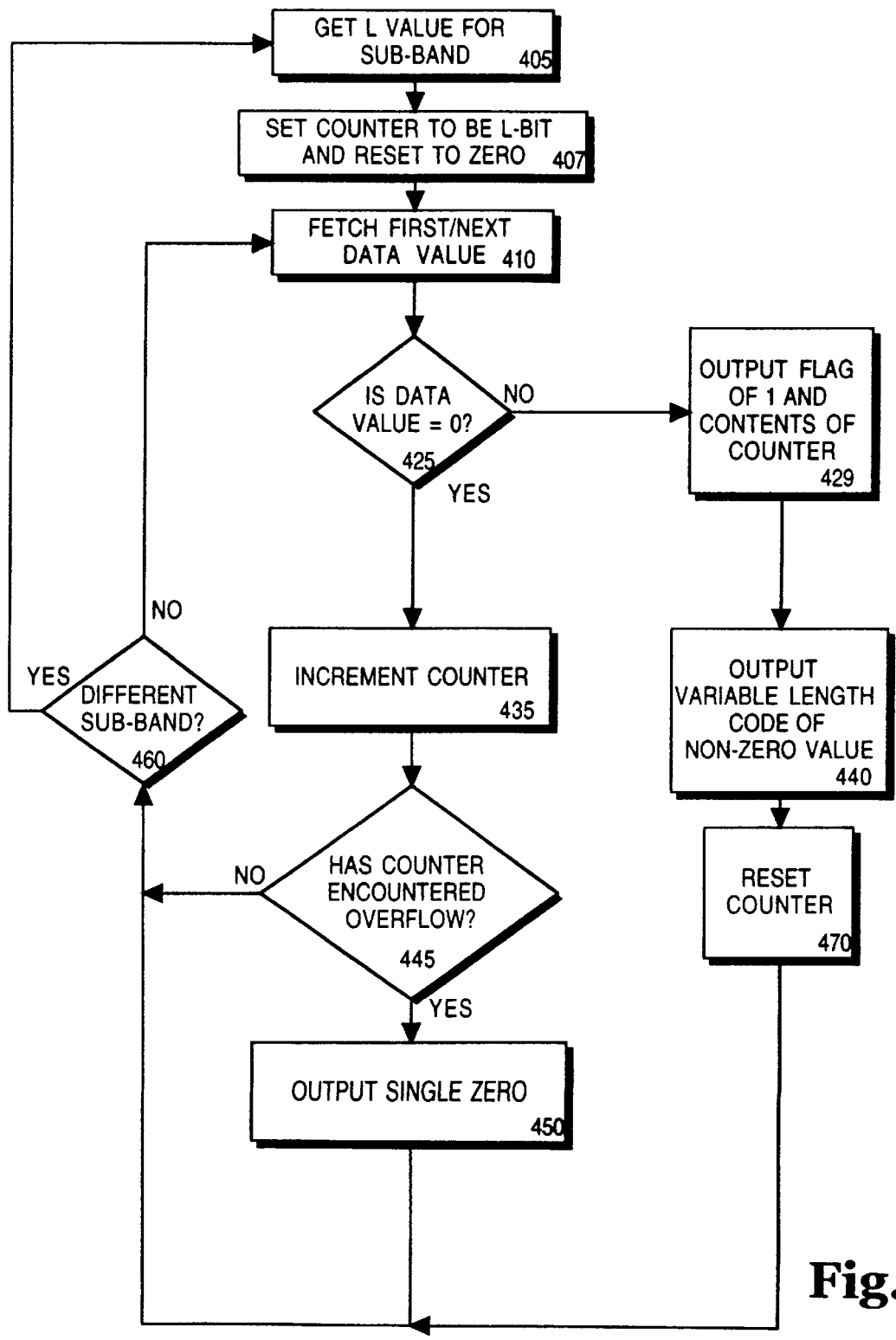
FIG. 4 is a flow diagram of enhanced zero run encoding according to one embodiment of the invention.

FIG. 4 is a flow diagram of enhanced zero run encoding according to an embodiment of the invention.

Enhanced zero run encoding may be used along with variable length coding to encode a set of data such as compressed quantized image data that has both zero and non-zero values. If DWT transform is used to generate the data set to be encoded, each sub-band may have been assigned its own L value. Thus, it may be desirable to fetch the L value for the particular sub-band being encoded (block 405). The sub-band association of the data may be gleaned by examining the row and column of the data value. As shown in FIG. 3, the position of the data also indicates which sub-band the data value belongs to. Next, a counter is configured to run as an L-bit counter (which may be loaded from a register holding the value of L) and his counter is reset to zero (block 407). Next, each data value (whether the very first data value in the sub-band or subsequent values) is fetched from the data set (block 410). In encoding the fetched data value, the first step is to check whether the data value is equal to zero or is a non-zero value (block 425).

If the data value is a zero, the counter is incremented to track the presence of the zero (block 435). If the L-bit counter indicates an overflow condition, then exactly $2^L$ zeroes have been encountered (checked at block 445). When $2^L$ zeroes are encountered, according to an embodiment of the invention, a single zero is output to so indicate (block 450). If no other zeroes follow in the run, then the special race condition of an exact multiple of $2^L$ zeroes preceding a non-zero value may occur. If the L-bit counter does not indicate an overflow condition, then less than $2^L$ zeroes have been encountered (checked at block 445). Encoding flow control proceeds from blocks 455 (if the condition expressed in block 445 is false), 450 and 470 to block 460 checking whether a new sub-band will be encountered by the fetch of the data value. Even though the data value is not yet fetched, the position of the data value just encoded and the direction of fetching (e.g. row-wise) permit the encoder to determine whether a data of a different sub-band is being encountered next. Further, the encoder may process the data sub-band by sub-band, completing all the data values in one sub-band rather than proceeding in a strictly in one direction or another. If a different sub-band is being encountered, then the encoder fetches the L value correspondingly assigned to that sub-band (block 405). Again the counter is reconfigured to be of L bits and reset to zero (407).

If a different sub-band was not encountered, or if so, proceeding from block 407, the first/next data value is fetched with processing repeating as above. If the data value fetched is not zero, (checked at block 425) then the following flow is initiated. Before encoding the non-zero value, the outputting of the zero run code must be completed. Thus, according to block 429 a flag of 1 and the contents of the counter, which is a word R of L bits, are output. In the case where the length of the run preceding the non-zero value is exactly a multiple $2^L$, the L-bit counter's state will be all zero since the counter will have overflowed upon encountering the $2^L$ zero in the run. If the counter has overflowed, then a flag of 1 and L zeroes (the contents of the overflown counter) will be output which is in accordance with preventing the race conditions above. Even though no actual data value is being represented in such a case, the outputting of a flag 1 followed by the word R having all zeroes (a separation) guarantees that the decoder will recognize if and also where the variable length code for the non-zero value is to begin. If the total length of the run preceding the non-zero value is not an except multiple of $2^L$, then the counter holds an L-bit value other than all zeroes. When output along with a flag of 1, in accordance with block 429, this indicates the number of zeroes less than $2^L$ comprising the final portion of the run. With the run thus encoded, then the variable length code of the non-zero value may be output (block 440). When the non-zero value is encoded, then the counter is reset (block 470). Flow control then returns to block 460 to check for a different sub-band being encountered. If two non-zero values are consecutively positioned in the data set, then a flag of 1 and L zeroes will be placed between the two variable length codes for those non-zero values, since the counter will still be at all zero state. The encoding flow of FIG. 4 repeats until all values in the data set, perhaps sub-band by sub-band, are encoded. When the very end of the data set or sub-band is encountered and the counter still has non-zero contents, then these contents are output (not shown). This case is a peculiar case where the end of the data set (or sub-band) contains less than $2^L$ zeroes. The encoding flow of FIG. 4 is one exemplary embodiment which one of ordinary skill in the art can readily modify is desired.

Figure 5:
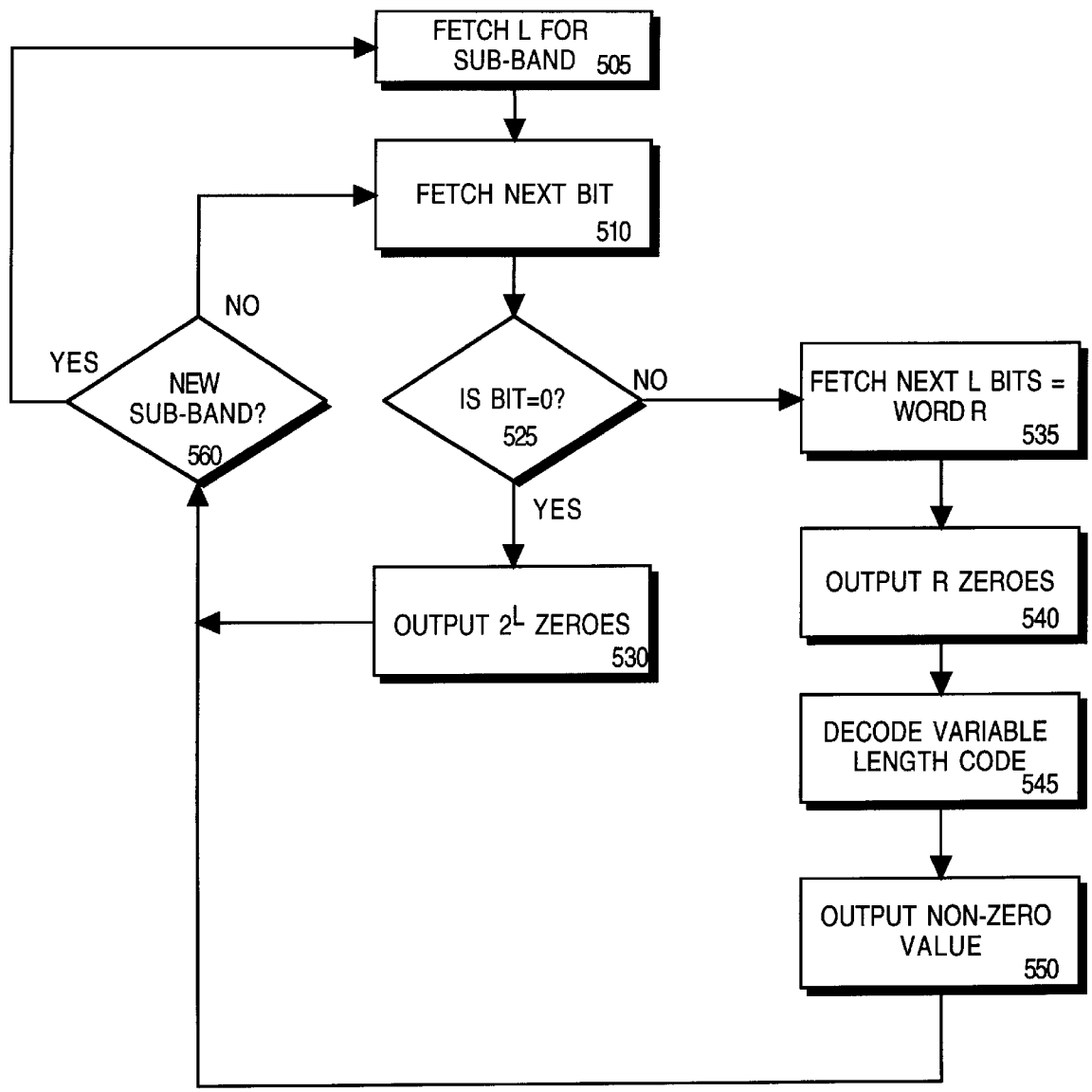
FIG. 5 is a block diagram of enhanced zero run decoding according to one embodiment of the invention.

FIG. 5 is a flow diagram of an enhanced zero run decoding according to an embodiment of the invention.

The decoding flow exemplified in FIG. 5 can decode a data set encoded by a procedure such as that exemplified in FIG. 4. The first step in the decoding procedure is to fetch an L value for the current sub-band being decoded (block 505). As described above, the set of L values for the various sub-bands may be transmitted as a header to the encoded data set. The next step is to fetch the first/next bit in the encoded data set (block 510). If the fetched bit is a zero (checked at block 525), then $2^L$ zeroes are output as the decoded equivalent (block 530). If the bit is a one, then the next L bits (which comprise the word R) are fetched form the encoded data (block 535). This flag of one signals that the end of the run has been encountered, and that a variable length code of a non-zero value will follow after the L bits. A number of zeroes equal to the decimal equivalent of the word R are then output (block 540). Where the block R contains all zeroes, nothing is output, since such a structure merely acts as a separator to mark the start of a variable length code for a non-zero value. Next, this variable length code is decoded (block 545), by use of a Look-Up-Table(s) (LUTs) or other means. This non-zero value is then output as part of the decoded data (block 550).

Either from block 530 or block 550, processing flow continues by checking for the n-countering of a new sub-band (checked at block 560). If a new sub-band is encountered, then the value of L corresponding to that sub-band is fetched (block 505), otherwise the next bit is fetched (block 510) and processing repeats. The decoding process described above repetitively continues until the end of the encoded data set is reached.

Figure 6:
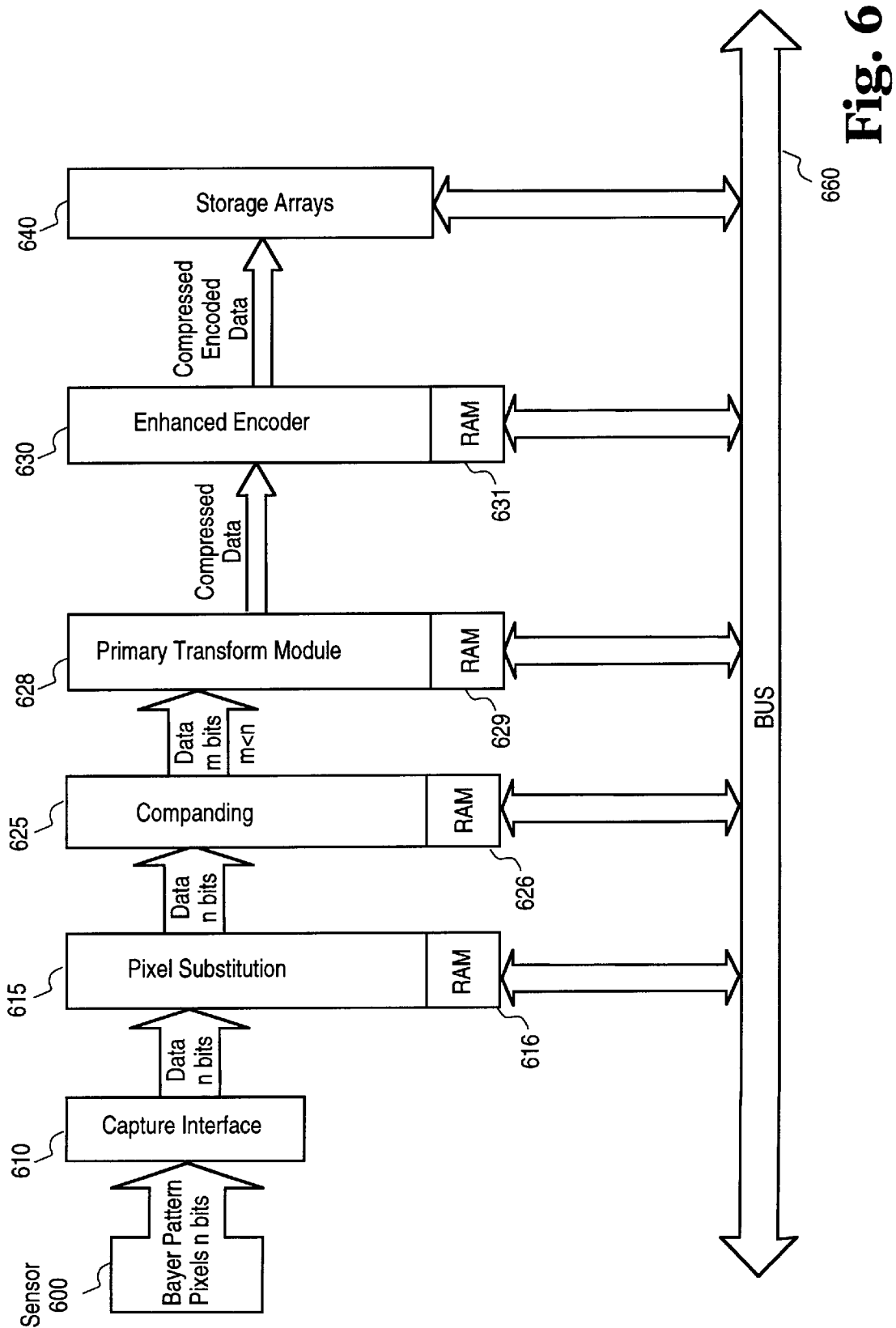
FIG. 6 is a block diagram of an image processing apparatus according to an embodiment of the invention.

FIG. 6 is a block diagram of an image processing apparatus according to an embodiment of the invention.

FIG. 6 is a block diagram of internal image processing components of an imaging device incorporating at least one embodiment of the invention including an enhanced zero run encoder. In the exemplary circuit of FIG. 6, a sensor 600 generates pixel components which are color/intensity values from some scene/environment. The n-bit pixel values generated by sensor 600 are sent to a capture interface 610. Sensor 600 will typically sense one of either R, G, or B components from one "sense" of an area or location (pixel). Thus, the intensity value of each pixel is associated with only one of three (or four if G1 and G2 are considered separately) color planes and may form together a Bayer pattern raw image. These R, G and B color "channels" may be compressed and encoded separately or in combination, whichever is desired by the application. Capture interface 610 resolves the image generated by the sensor and assigns intensity values to the individual pixels.

It is typical in any sensor device that some of the pixel cells in the sensor plane may not respond to the lighting condition in the scene/environment properly. As a result, the pixel values generated from these cell may be defective. These pixels are called "dead pixels." The "pixel substitution" unit 615 replaces each dead pixel by the immediate previously valid pixel in the row. A RAM 616 consists of the row and column indices of the dead pixels, which are supplied by the sensor. This RAM 616 helps to identify the location of dead pixels in relation to the captured image. Compounding module 625 is designed to convert each original pixel of n-bit (typically n=10) intensity captured from the sensor to an m-bit intensity value, where m<n (typically, m=8). Companding module 625 is not needed if the sensor 600 and capture interface 610 provide an m-bit per-pixel value.

A primary transform module 628 receives companded sensor image data and performs image transformation such as that discussed in the DWT patent. A RAM 629 can be used to store DWT coefficients and/or quantization thresholds for each channel/sub-band as desired in executing DWT compression and quantization techniques. Primary transform module 628 can be designed to provide compressed channel by channel and sub-band by sub-band outputs to enhanced encoder 630. Enhanced encoder 630 may be designed similar to the design presented in FIG. 4. According to one embodiment of the invention, enhanced encoder 630 can be equipped to carry out a variety of binary encoding schemes, such as the enhanced zero run encoding presented in the embodiments of the invention. A RAM 631 may be configured to store the variable length encoding LUTs and the enhanced zero run length parameters utilized by the enhanced encoder 630. Enhanced encoder 630 provides the encoded and compressed data to storage arrays 640. As a result of enhanced zero run encoding, the storage arrays 640 may be designed smaller in size than those of typical non-binary encoders that uniformly apply only one of the many possible binary encoding techniques to image data. Enhanced zero run encoding is particularly advantageous in the encoding of image data, whether compressed or not, since each image (or image compression by-product such as sub-band) may have unique characteristics that would favor one set of L values over another.

Each of the RAM tables 616, 626, 629 and 631 can directly communicate with a bus 660 so that their data can be loaded and then later, if desired, modified. Further, those RAM tables and other RAM tables may be used to store intermediate result data as needed. When the data in storage arrays 640 is ready to be transferred external to the imaging apparatus of FIG. 6 it may be placed upon bus 660 for transfer. Bus 660 also facilitates the update of RAM tables 616, 626, 629 and 631 as desired.

Figure 7:
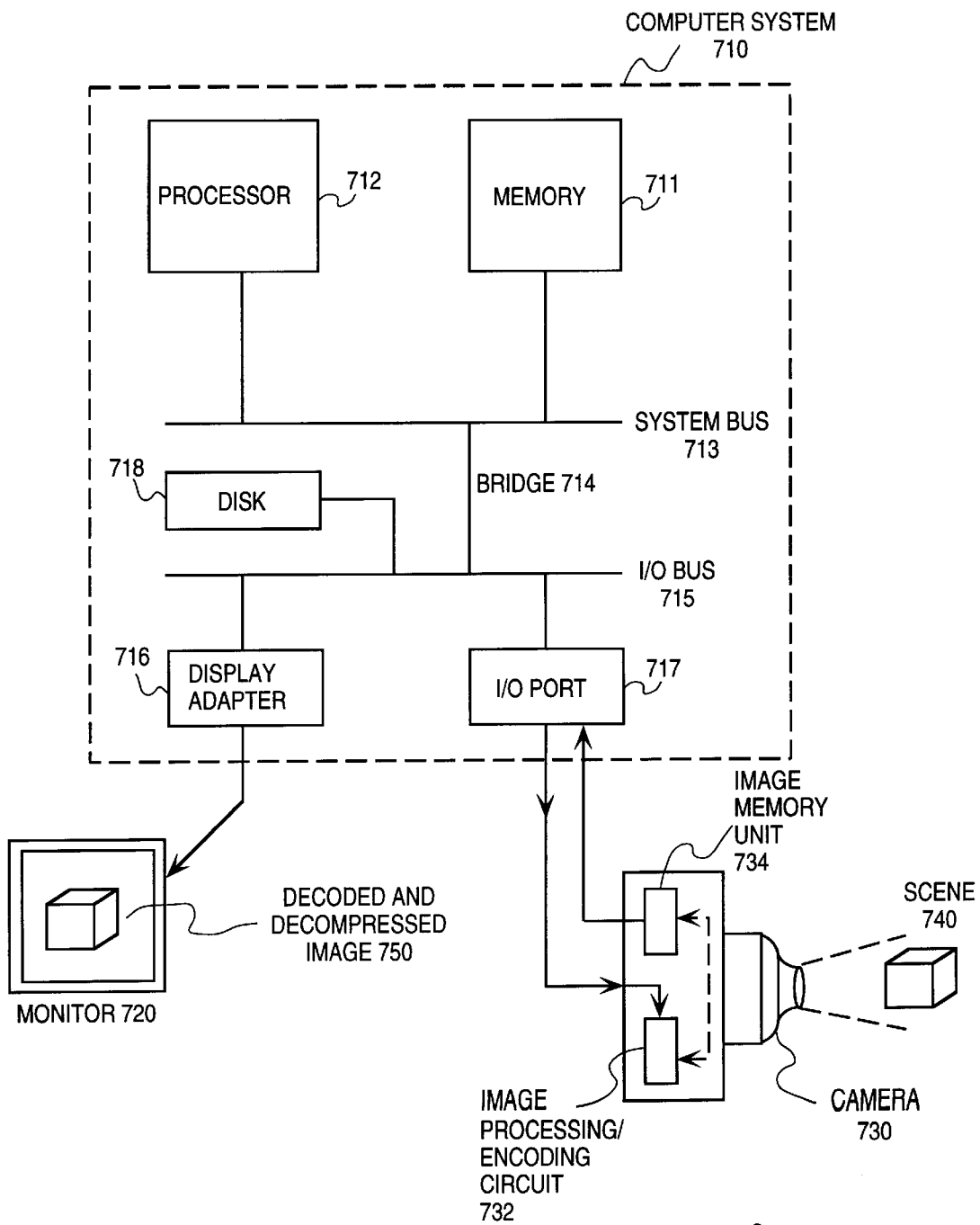
FIG. 7 is a system diagram of one embodiment of the invention.

FIG. 7 is a system diagram of one embodiment of the invention.

Illustrated is a computer system 710, which may be any general or special purpose computing or data processing machine such as a PC (personal computer), coupled to a camera 730. Camera 730 may be a digital camera, digital video camera, or any image capture device or imaging system, or combination thereof and is utilized to capture an image of a scene 740. Essentially, captured images are processed by an image processing circuit 732 so that they can be efficiently stored in an image memory unit 734, which may be a RAM or other storage device such as a fixed disk. The image contained within image memory unit 734 that is destined for computer system 710 can be according to one embodiment of the invention, stored directly as a compressed and enhanced zero run encoded image. In most digital cameras that can perform still imaging, images are stored first and downloaded later. This allows the camera 730 to capture the next object/scene quickly without additional delay. The invention in its various embodiments, particularly in providing a compressed image that is directly transformed from an 8-bit Bayer pattern, reduces the computation requirements of the camera 730 and the associated costs, allowing for a more inexpensive camera.

The image processing circuit 732 carries out the compression and enhanced zero run encoding in accordance with one or more embodiments of the invention. When a compressed and encoded image is downloaded to computer system 710, it may be decoded and then rendered to some output device such as a printer (not shown) or to a monitor device 720. Compressed and encoded image decoding (e.g., like that shown in FIG. 5) may be achieved using a processor 712 such as the Pentium™ processor (a product of Intel Corporation) and a memory 711, such as RAM, which is used to store/load instruction addresses and result data. Computer system 710 may provide to camera 730 the LUTs needed for enhanced zero run encoding and variable length non-zero value encoding such as MHC.

In an alternate embodiment, the enhanced zero run encoding technique described above may be achieved in a software application running on computer system 710 rather than directly in camera 730. In such an embodiment, the image processing circuit may advantageously store only the compressed image. The application(s) used to perform the encoding and/or decoding after download from camera 730 may be from an executable compiled from source code written in a language such as C++. The instructions of that executable file, which correspond with instructions necessary to scale the image, may be stored to a disk 718 or memory 711. Further, such application software may be distributed on a network or a computer-readable medium for use with other systems.

When an image, such as an image of a scene 740, is captured by camera 730, it is sent to the image processing circuit 732. Image processing circuit 732 consists of ICs and other components which execute, among other functions, the enhanced zero run encoding of a compressed image. The image memory unit 734 will store the compressed and encoded data. Once all pixels are processed and stored or transferred to the computer system 710 for rendering the camera 730 is free to capture the next image. When the user or application desires/requests a download of images, the encoded image data in the image memory unit, are transferred from image memory unit 734 to the I/O port 717. I/O port 717 uses the bus-bridge hierarchy shown (I/O bus 715 to bridge 714 to system bus 713) to temporarily store the data into memory 711 or, optionally, disk 718. Computer system 710 has a system bus 713 which facilitates information transfer to/from the processor 712 and memory 711 and a bridge 714 which couples to an I/O bus 715. I/O bus 715 connects various I/O devices such as a display adapter 716, disk 718 and an I/O port 717, such as a serial port. Many such combinations of I/O devices, buses and bridges can be utilized with the invention and the combination shown is merely illustrative of one such possible combination.

In another embodiment of the invention, the enhanced zero run encoding may be utilized to perform the compression of ordinary non-image data such as the compression of text files as well. Such data may be stored in a disk, memory 711 or other storage mechanism and can be compressed by virtue of being encoded in the enhanced zero run technique disclosed in the invention. In data that contains a large number of consecutive zeroes, an enhanced zero run encoding scheme that is capable of representing an arbitrarily large run-length value would be particularly efficient.

The exemplary embodiments described herein are provided merely to illustrate the principles of the invention and should not be construed as limiting the scope of the invention. Rather, the principles of the invention may be applied to a wide range of systems to achieve the advantages described herein and to achieve other advantages or to satisfy other objectives as well.

What is claimed is:

1. A method of run-length encoding comprising:
   determining a number of bits L utilized to store a word R, said word R accompanied by a flag, said flag and word R comprising a structure; and
   encoding the length of a run of similar data values, said length larger than allowable by said L bits of the word R even if each of said L bits were fully utilized, said encoding achieved by utilizing a single bit to represent $2^L$ similar data values in the run.

2. The method according to claim 1, wherein said run refers to the number of zeroes between two non-zero values in a set of data.

3. The method according to claim 2, wherein said non-zero values are encoded using a variable length code.

4. The method according to claim 2, wherein said set of data is sub-band data obtained from a Discrete Wavelet Transform (DWT).

5. The method according to claim 3, wherein said non-zero values are used to address a look-up table and derive therefrom the Huffman code corresponding to said non-zero values.

6. The method according to claim 4, wherein each sub-band of data is assigned a separate value of L concordat with the entropy properties of that sub-band.

7. The method according to claim 6, wherein said set of sub-band data is quantized prior to being encoded.

8. The method according to claim 2, wherein the encoding includes:
   specifying a structure with a flag of 1 indicating that the corresponding word R in said structure with a flag of 1 forms a portion of the length of the run, said portion smaller than $2^L$ in length.

9. The method according to claim 8, wherein a structure with a flag of 1 and a word R having L bits of zeroes indicates that a variable length code of a non-zero value is to follow.

10. The method according to claim 4, wherein encoding comprises:
    setting a counter to count in L bits, and resetting said counter to have L zeroes;
    fetching a data value; and
    determining if said fetched data value is a zero or non-zero value, if said fetched data value is a zero then performing a first sub-procedure, and if said fetched data value is a non-zero value, then performing a second sub-procedure.

11. The method according to claim 10, wherein said first sub-procedure includes:
    incrementing said counter; and
    determining whether a counter overflow has occurred, and if so outputting a single zero to encode $2^L$ zeroes.

12. A machine-readable medium having stored thereon data representing sequences of instructions, said sequences of instructions which, when executed by a processor, cause said processor to:
    determine a number of bits L utilized to store a word R, said word R accompanied by a flag, said flag and word R comprising a structure; and
    encode the length of a run of similar data values, said length larger than allowable by said L bits of the word R even if each of said L bits were fully utilized, said encoding achieved by utilizing a single bit to represent $2^L$ similar data values in the run.

13. An imaging system comprising:
    an encoder, said encoder configured to binary encode a data set of zero and non-zero values, said zero values encoded by determining a number of bits L utilized to store a word R, said word R accompanied by a flag, said flag and word R comprising a structure, and then encoding the length of a run of similar data values, said length larger than allowable by said L bits of the word R even if each of said L bits were fully utilized, said encoding achieved by utilizing a single bit to represent $2^L$ similar data values in the run.

14. The imaging system according to claim 13, further comprising a compressor coupled to said encoder, said encoder configured to receive said data values as compressed image data output by said compressor.

15. The imaging system according to claim 13, comprising:
    a storage array coupled to said encoder, said storage array configured to store the encoded output of said encoder.

16. The imaging system according to claim 14, comprising a digital camera, said digital camera incorporating said encoder and said compressor.

17. The imaging system according to claim 16, further comprising:
    a computer system coupled to said encoder configured to decode said encoded data, said computer system further configured to decompress said decoded data and display an image therefrom.

\* \* \* \* \*